US012772460B2

(12) United States Patent
Zhang et al.

(10) Patent No.: US 12,772,460 B2
(45) Date of Patent: Oct. 20, 2026

(54) MEMORY CELL AND MANUFACTURING METHOD THEREOF, THREE-DIMENSIONAL MEMORY AND OPERATION METHOD THEREOF

(71) Applicant: INSTITUTE OF MICROELECTRONICS, CHINESE ACADEMY OF SCIENCES, Beijing (CN)

(72) Inventors: Gang Zhang, Beijing (CN); Chunlong Li, Beijing (CN); Zongliang Huo, Beijing (CN); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 342 days.

(21) Appl. No.: 18/705,185

(22) PCT Filed: Nov. 10, 2021

(86) PCT No.: PCT/CN2021/129800
§ 371 (c)(1),
(2) Date: Apr. 26, 2024

(87) PCT Pub. No.: WO2023/082096
PCT Pub. Date: May 19, 2023

(65) Prior Publication Data

US 2026/0136562 A1 May 14, 2026

(51) Int. Cl.
*H10B 63/00* (2023.01)
*G11C 13/00* (2006.01)
(Continued)

(52) U.S. Cl.
CPC ......... *H10B 63/34* (2023.02); *G11C 13/0026* (2013.01); *G11C 13/0038* (2013.01);
(Continued)

(58) Field of Classification Search
None
See application file for complete search history.

(56) References Cited

U.S. PATENT DOCUMENTS 8,803,214 B2 * 8/2014 Tang .................... G11C 13/004 257/314
11,545,437 B2 1/2023 Watanabe et al.
(Continued)

FOREIGN PATENT DOCUMENTS

CN 106409768 A * 2/2017 ............... H10D 1/00
CN 110767656 A 2/2020
(Continued)

OTHER PUBLICATIONS

International Search Report (with partial translation) and Written Opinion dated Aug. 10, 2022, issued in corresponding International Patent Application No. PCT/CN2021/129800.

*Primary Examiner* — Michael Lebentritt
(74) *Attorney, Agent, or Firm* — Morgan, Lewis & Bockius LLP

(57) ABSTRACT

A memory cell and manufacturing method thereof, and a three-dimensional memory and an operation method thereof. The memory cell includes: a stack on a substrate and including: channel holes passing through the stack and part of the substrate, the stack including the second stack material layer which is etched to form a ring-shaped limiting component; a gate dielectric layer on a surface of the channel holes with the ring-shaped limiting component; a channel layer on a surface of the gate dielectric layer; and a variable resistance layer on a surface of the channel layer corresponding to the ring-shaped limiting component, where
(Continued)

a gate voltage applied to the second stack material layer and a pulse signal applied to a bit line connected to the channel layer are controlled to change a resistance state of the variable resistance layer, so as to perform reading, writing or erasing on the variable resistance layer.

19 Claims, 15 Drawing Sheets

(51) Int. Cl.
*H10B 63/10* (2023.01)
*H10N 70/00* (2023.01)

(52) U.S. Cl.
CPC ........ *G11C 13/004* (2013.01); *G11C 13/0069* (2013.01); *G11C 13/0097* (2013.01); *H10B 63/10* (2023.01); *H10B 63/845* (2023.02); *H10N 70/021* (2023.02); *H10N 70/826* (2023.02)

(56) References Cited

U.S. PATENT DOCUMENTS

| | | | | |
|---|---|---|---|---|
| 2012/0070944 | A1* | 3/2012 | Kim | H10B 43/20<br>257/E21.614 |
| 2012/0161094 | A1* | 6/2012 | Huo | H10B 63/845<br>438/238 |
| 2021/0074643 | A1 | 3/2021 | Watanabe et al. | |

FOREIGN PATENT DOCUMENTS

| | | | | |
|---|---|---|---|---|
| CN | 112820736 | A | 5/2021 | |
| DE | 102007040826 | A1 * | 2/2009 | H10N 70/245 |
| JP | 2021-174787 | A | 11/2021 | |
| KR | 102492296 | B1 * | 1/2023 | H01L 27/1157 |
| WO | WO-2012088862 | A1 * | 7/2012 | H10D 88/00 |

* cited by examiner

MEMORY CELL AND MANUFACTURING METHOD THEREOF, THREE-DIMENSIONAL MEMORY AND OPERATION METHOD THEREOF

CROSS REFERENCE TO RELATED APPLICATION(S)

This application is a Section 371 National Stage Application of International Application No. PCT/CN2021/129800, filed on Nov. 10, 2021, and entitled "MEMORY CELL AND MANUFACTURING METHOD THEREOF, THREE-DIMENSIONAL MEMORY AND OPERATION METHOD THEREOF".

TECHNICAL FIELD

The present disclosure relates to a technical field of three-dimensional memory, and more specifically to a memory cell and a manufacturing method thereof, a three-dimensional memory and an operation method thereof.

BACKGROUND

As the number of layers in a stack of a three-dimensional memory is constantly increased, for example, from 32 layers to 64 layers and then to 256 layers, a spacing between word lines of the three-dimensional memory is constantly decreased accordingly, for example, from 25 nm to 17 nm. The continuous increase in the number of layers in the stack of an existing charge trapping three-dimensional memory and/or floating gate three-dimensional memory based on gate all round configuration will face two following physical limits. First, the existing three-dimensional memory adopts a P-type polycrystalline semiconductor channel or a non-doped polycrystalline semiconductor (e.g., polysilicon) channel, and as a length of the channel is constantly increased, a channel current is constantly decreased until the occurrence of a read failure caused by that the channel current is lower than the lower limit of the read current for driving. Second, as the spacing between word lines (WL) is continually decreased, a coupling between the word lines is continually increased until the occurrence of an operation failure of the charge trapping unit or the floating gate unit caused by crosstalk between the adjacent WLs.

As a vertically stacking capability of the three-dimensional memory is constantly expanding, such as 512 layers, 1024 layers, etc., is desired, the continual reduction of the spacing between WLs becomes an unavoidable requirement for the processes. Adopting a highly conductive N-type polycrystalline semiconductor as the channel material may greatly increase the channel current intensity, thereby increasing a vertically expanding capability of the three-dimensional memory. However, the N-type channel causes a small effective threshold window (Vth window) and thus not unsuitable for the existing three-dimensional memory. A resistive random access memory cell controlled by a channel current or a potential difference may get rid of the coupling between the word lines. Also, the WL is only used for cell selection, and the reduction of a voltage on the WL may further reduce the risk of breakdown between WLs. However, a resistive random access memory cell of a thin-film type fails to achieve a multi-bit (2-bit, 3-bit or 4-bit per cell) memory technology currently.

SUMMARY

The present disclosure provides a memory cell and a manufacturing method thereof, a three-dimensional memory and an operation method thereof.

An aspect of the present disclosure provides a memory cell, including: a stack on a substrate and including a plurality of channel holes passing through the stack and a part of the substrate, where the stack formed with the plurality of channel holes includes at least one second stack material layer, and a ring-shaped limiting component is formed by etching the at least one second stack material layer; a gate dielectric layer on a surface of the plurality of channel holes for which the ring-shaped limiting component is formed by etching; a channel layer on a surface of the gate dielectric layer; and a variable resistance layer on a surface of the channel layer corresponding to the ring-shaped limiting component, where a gate voltage applied to the at least one second stack material layer and a pulse signal applied to a bit line connected to the channel layer are controlled to change a resistance state of the variable resistance layer, so as to enable the memory cell to perform a reading operation, a writing operation or an erasing operation on the variable resistance layer.

Further, the stack includes a plurality of pairs of stacked layers, each pair of stacked layers includes a first stack material layer and the second stack material layer, and the first stack material layer and the second stack material layer are sequentially stacked on the substrate.

Further, the first stack material layer is an insulator layer, the second stack material layer is a metal dielectric layer, and the metal dielectric layer serves as a word line layer.

Further, a number of second stack material layers is positively correlated with a number of layers in the memory cell.

Further, the variable resistance layer is made of a variable resistance material or a phase change material.

Further, an array formed by the plurality of channel holes passing through the stack and the part of the substrate has a common source.

Further, the channel layer is an N-type semiconductor channel layer, and the substrate is an N-type substrate.

Further, the channel layer is an N-type polycrystalline semiconductor channel layer or an N-type single crystal semiconductor channel layer.

Further, the memory cell further includes an insulator material layer inside the plurality of channel holes without the material layer therein.

Further, the memory cell is configured such that when a data reading operation is performed on the memory cell, a current flows from a drain layer of the memory cell to the substrate.

Further, the memory cell is configured such that: when the data reading operation is performed on the memory cell, a bias voltage is applied to the drain layer, and the substrate is grounded; a gate layer of an unselected memory cell is grounded, and a negative gate voltage is applied to a gate layer of a selected memory cell; and a resistance state of the variable resistance layer of the selected memory cell is sensed, so as to determine a data state of the memory cell.

Further, the memory cell is configured such that: when a data writing operation is performed on the memory cell, a gate layer of an unselected memory cell is grounded, and a negative gate voltage is applied to a gate layer of a selected memory cell; the substrate is grounded; and a writing pulse is applied to a drain layer of the memory cell, where the writing pulse is sufficient to induce a tunneling effect in the memory cell, so that electrons are stored in the memory cell.

Further, the memory cell is configured such that: when a data erasing operation is performed on the memory cell, a drain layer of the memory cell is floated or grounded, and an erasing pulse is applied to a drain layer of the memory cell, where the erasing pulse is sufficient to induce a tunneling effect in the memory cell.

Another aspect of the present disclosure provides a method of manufacturing a memory cell, including: forming a stack on a substrate; forming a plurality of channel holes in the stack and a part of the substrate, and etching at least one sacrificial layer in the stack formed with the plurality of channel holes to form a ring-shaped limiting component; forming a gate dielectric layer, a channel layer and a variable resistance layer sequentially on a surface of each channel hole for which the ring-shaped limiting component is formed by etching; filling an insulator material layer inside each channel hole without the material layer therein; forming a bit line lead-out end on a part of a top of the channel layer; and etching the sacrificial layer in the stack, and replacing the sacrificial layer with a second stack material layer, where a gate voltage applied to at least one second stack material layer and a pulse signal applied to a bit line connected to the channel layer are controlled to change a resistance state of the variable resistance layer, so as to enable the memory cell to perform a reading operation, a writing operation or an erasing operation on the variable resistance layer.

Another aspect of the present disclosure provides a three-dimensional memory, including the memory cell as described above.

Another aspect of the present disclosure provides an operation method of a three-dimensional memory, including: controlling a voltage bias applied to a substrate, a drain layer and a gate layer of at least one memory cell in the three-dimensional memory, and performing a data writing operation, a data reading operation and a data erasing operation on the at least one memory cell in the three-dimensional memory, separately.

Further, performing the data reading operation on the at least one memory cell in the three-dimensional memory includes: triggering a data reading program; applying a negative gate voltage to a gate layer of a selected memory cell to turn off a channel corresponding to the selected memory cell; grounding a gate layer of an unselected memory cell and the substrate; applying a bias voltage to a drain layer of the memory cell; and sensing a resistance state of the variable resistance layer of the selected memory cell, so as to determine a data state of the memory cell.

Further, performing the data writing operation on the at least one memory cell in the three-dimensional memory includes: triggering a data writing program; grounding a gate layer of an unselected memory cell, and applying a negative gate voltage to a gate layer of a selected memory cell; grounding the substrate; and applying a writing pulse to a drain layer of the memory cell, where the writing pulse is sufficient to induce a tunneling effect in the memory cell, so that electrons are stored in the memory cell.

Further, performing the data erasing operation on the at least one memory cell in the three-dimensional memory includes: triggering a data erasing program; grounding a gate layer of an unselected memory cell, and applying a negative gate voltage to a gate layer of a selected memory cell; and applying an erasing pulse to a drain layer of the memory cell, where the erasing pulse is sufficient to induce a tunneling effect in the three-dimensional memory.

BRIEF DESCRIPTION OF THE DRAWINGS

For a more complete understanding of the present disclosure and its advantages, reference will be made to the following description taken in conjunction with accompanying drawings, in which.

DETAILED DESCRIPTION OF EMBODIMENTS

Figure 1:
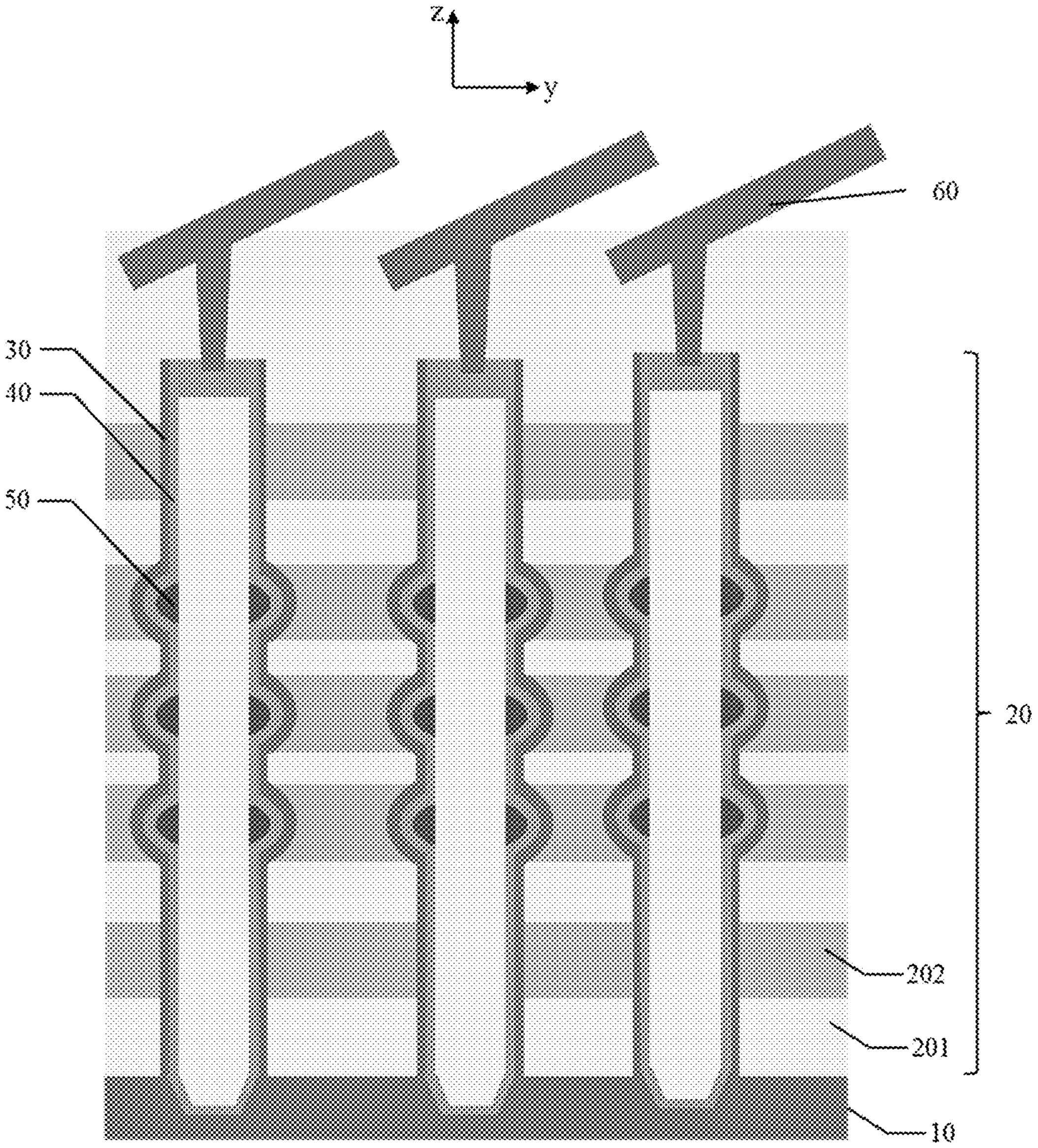
FIG. 1 schematically shows a partial structural schematic diagram of a cross-section of a memory cell according to an embodiment of the present disclosure.

Hereinafter, embodiments of the present disclosure will be described with reference to the accompanying drawings. However, it will be understood that these descriptions are exemplary only and are not intended to limit the scope of the present disclosure. In the following detailed description, for convenience of explanation, numerous specific details are set forth to provide a comprehensive understanding of embodiments of the present disclosure. However, it is clear that one or more embodiments may be implemented without these specific details. In addition, in the following description, descriptions of well-known structures and techniques are omitted to avoid unnecessarily confusing the concepts of the present disclosure.

It will be understood that when an element (such as a layer, film, region, or substrate) is described as being "on" another element, it may be directly on the another element or an intervening element may also be present. In addition, in the specification and claims, when an element is described as being "connected" to another element, it can be "directly connected" to the another element, or "connected" to the another element through a third element.

When describing embodiments of the present disclosure in detail, for convenience of explanation, a cross-sectional view showing a device structure is not partially enlarged according to a general scale, and a schematic diagram is only an example, which should not limit the scope of the present disclosure. In addition, three-dimensional dimensions of a length, a width and a depth should be included in actual production.

Embodiments of the present disclosure provide a memory cell, including: a stack on a substrate and including: a plurality of channel holes passing through the stack and a part of the substrate, where the stack formed with the plurality of channel holes includes at least one second stack material layer, and a ring-shaped limiting component is formed by etching the at least one second stack material layer; a gate dielectric layer located on a surface of the plurality of channel holes for which the ring-shaped limiting component is formed by etching; a channel layer located on a surface of the gate dielectric layer; and a variable resistance layer located on a surface of the channel layer corresponding to the ring-shaped limiting component. A gate voltage applied to the at least one second stack material layer and a pulse signal applied to a bit line connected to the channel layer are controlled to change a resistance state of the variable resistance layer, so as to enable the memory cell to perform a reading operation, a writing operation or an erasing operation on the variable resistance layer.

Embodiments of the present disclosure provide a memory cell in which the ring-shaped limiting component is formed inside the channel hole, so that a variable resistance ring is formed after the variable resistance layer is deposited, and a resistance state of a corresponding variable resistance ring may be read by reading the channel current. For the variable resistance ring, a multi-bit memory writing and supporting page programming are achieved through a sudden falling pulse; and also, an erasing operation and supporting block erase are achieved through a slow falling pulse.

The technical solutions of the present disclosure will be described in detail below in combination with a structure of a memory cell in a specific embodiment of the present disclosure. It will be understood that a material layer, a shape and a structure of each part of the structure of the memory cell shown in FIG. 1 are only examples to help those skilled in the art understand the technical solutions of the present disclosure, and are not intended to limit the scope of protection of the present disclosure.

FIG. 1 schematically shows a partial structural schematic diagram of a cross-section of a memory cell according to an embodiment of the present disclosure.

As shown in FIG. 1, the memory cell according to embodiments of the present disclosure includes: a substrate 10, which may be a conductive substrate 10, such as an N-type substrate; a stack 20 on the substrate 10, including: a plurality of channel holes passing through the stack 20 and a part of the substrate 10, where the stack 20 with the plurality of channel holes includes at least one second stack material layer 202, and a ring-shaped limiting component is formed by etching the at least one second stack material layer 202; a gate dielectric layer 30 located on a surface of the plurality of channel holes for which the ring-shaped limiting component is formed by etching; a channel layer 40 located on a surface of the gate dielectric layer 30; and a variable resistance layer 50 located on a surface of the channel layer 40 corresponding to the ring-shaped limiting component. A gate voltage applied to the at least one second stack material layer 202 and a pulse signal applied to a bit line connected to the channel layer 40 are controlled to change a resistance state of the variable resistance layer 50, so as to enable the memory cell to perform the reading operation, the writing operation or the erasing operation on the variable resistance layer.

According to an embodiment of the present disclosure, the stack 20 includes: a plurality of pairs of stacked layers, and each pair of stacked layers includes a first stack material layer 201 and the second stack material layer 202. The first stack material layer 201 and the second stack material layer 202 are sequentially stacked on the substrate 10. In an embodiment, the first stack material layer 201 is an insulator layer, such as OX, etc. The second stack material layer 202 is a metal dielectric layer, which serves as a word line layer. The word line layer of the stack 20 closest to the substrate 10 is a lower selection layer, and the word line layer of the stack 20 farthest away from the substrate 10 is an upper selection layer. Specifically, an array of channel holes in the stack 20 is formed by etching. Sacrificial layers corresponding to the lower selection layer and the upper selection layer may be made of carbon-doped silicon nitride, so that the sacrificial layers corresponding to the lower selection layer and the upper selection layer are not etched to form the ring-shaped limiting component during an etching process for forming the ring-shaped limiting component. A sacrificial layer corresponding to another metal dielectric layer among the second stack material layers 202 may be made of silicon nitride, and is etched to form the ring-shaped limiting component during the etching process for forming the ring-shaped limiting component.

In an embodiment of the present disclosure, as shown in FIG. 1, the gate dielectric layer 30, the channel layer 40 and the variable resistance layer 50 are sequentially grown on a surface of the plurality of channel holes for which the ring-shaped limiting component is formed by etching. The variable resistance layer 50 is located on a surface of the channel layer 40 corresponding to the ring-shaped limiting component, so as to form a variable resistance ring, which has different resistance states under different pulse excitations. The variable resistance layer 50 is made of a variable resistance material such as GST, etc., or a phase change material such as $HfO_2$, etc.

Specifically, the channel layer 40 is an N-type semiconductor channel layer, and specifically, it may be an N-type polycrystalline semiconductor channel layer or a single-crystal semiconductor channel layer. The channel layer 40 is made of a material such as silicon, germanium, silicon germanium or III-V semiconductor materials, or is made of other materials with semiconductor switching property, such as NZO, graphene, etc. The channel layer 40 and the word line layer form an MOS structure through an insulator layer therebetween. As shown in FIG. 1, each channel hole passes through the stack 20 and a part of the substrate 10, and the array formed by the plurality of channel holes has a common source.

In an embodiment of the present disclosure, the channel in which the variable resistance layer 50 is grown is filled with an insulator layer 202, which is used for isolation.

The number of layers in the memory cell is positively correlated with the number of second stack material layers. The more the second stack material layers, the more layers in the memory cell. The specific number of layers in the memory cell is not limited by embodiments of the present disclosure, which may be 512 layers, 1024 layers, etc., and may be determined according to actual application requirements.

In an embodiment of the present disclosure, both the word line layer and the bit line layer are metal lines with a small size. As shown in FIG. 1, the word line layer 202 is in the same direction as the substrate 10 in the y-axis direction. The word line layer may cover a plurality of strings in the x-axis direction, such as 9 strings, 16 strings, 19 strings, etc. The word line layer 202 is connected to the gate dielectric layer 30 and is used to receive a bias voltage for the gate dielectric layer 30. The bit line 60 is connected to a drain layer of the memory cell, so as to provide a pulse signal to the drain layer. Each bit line 60 may control one or more strings at the same time, which is not limit by embodiments of the present disclosure.

Figure 2:
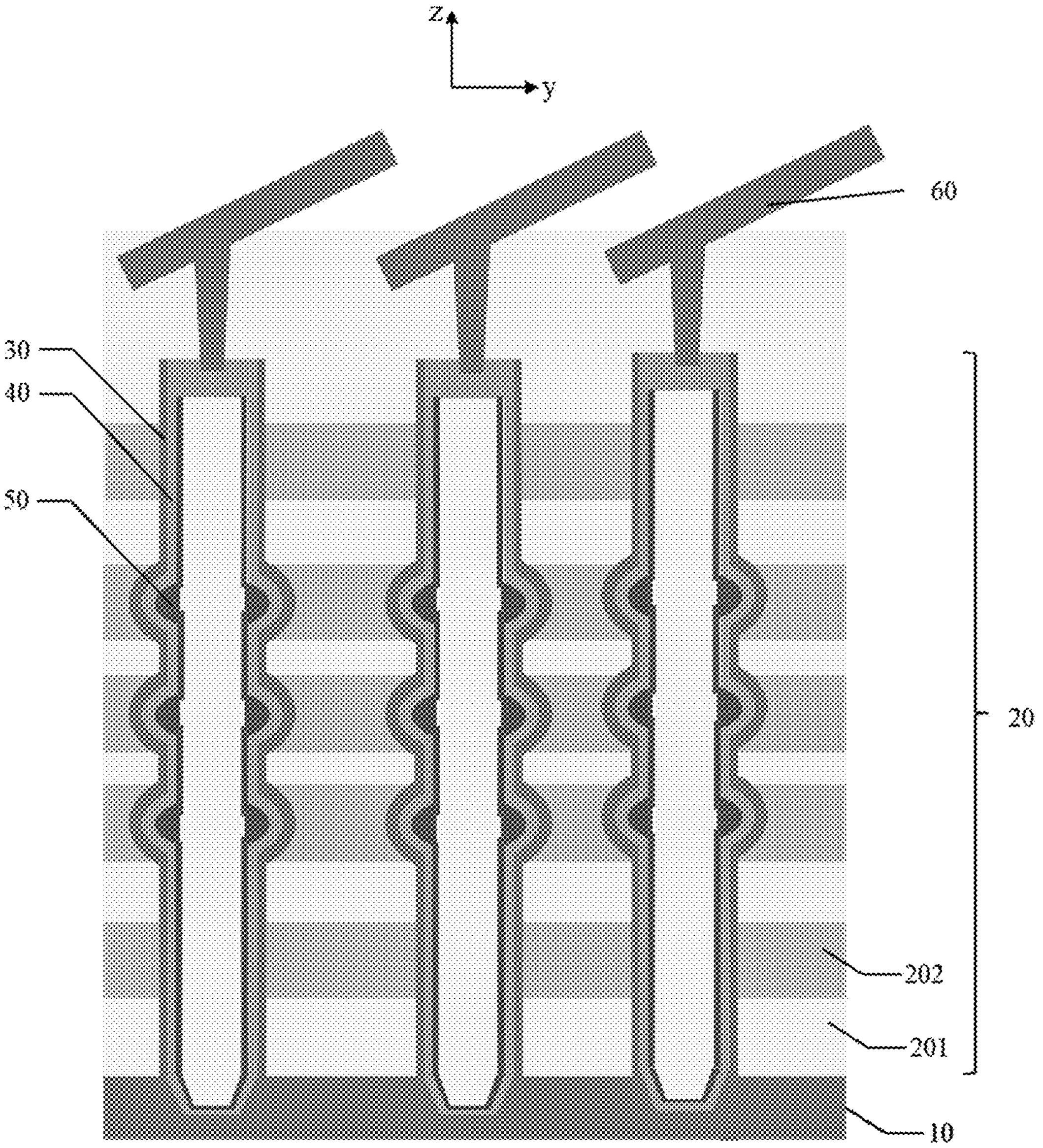
FIG. 2 schematically shows a partial structural schematic diagram of a cross-section of a memory cell according to another embodiment of the present disclosure.

FIG. 2 shows another structural schematic diagram of a memory cell according to an embodiment of the present disclosure. The difference between this structure and the memory cell shown in FIG. 1 is that a variable resistance film connection layer (i.e., part of the residual variable resistance layer 50) exists in an area outside the variable resistance ring. This connection layer is a process residue and is always in a high resistance state, and this connection layer does not participate in the data reading, writing and erasing operations.

Figure 3:
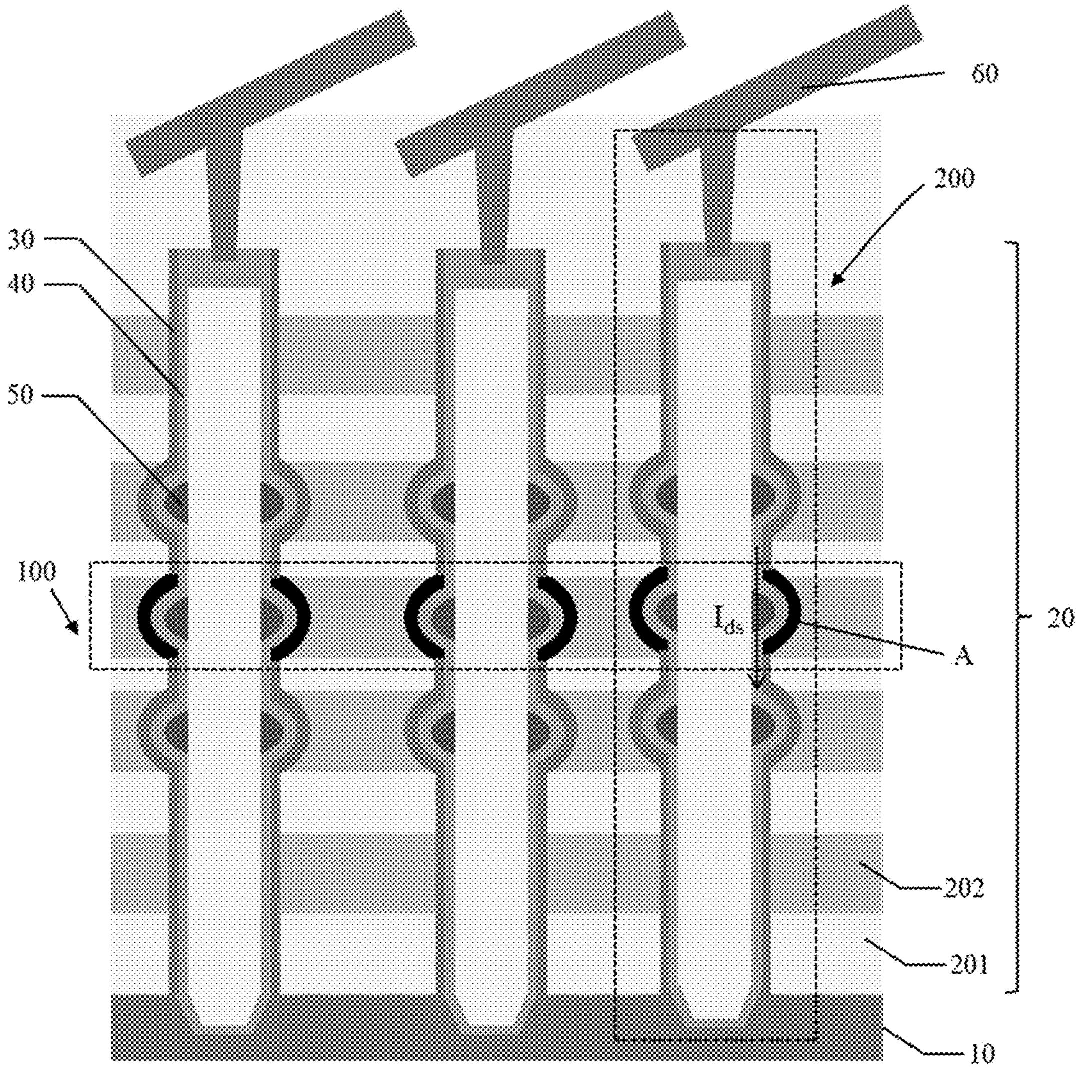
FIG. 3 schematically shows a schematic diagram of a current flow direction during a data reading or writing operation of the memory cell according to FIG. 1.

FIG. 3 schematically shows a schematic diagram of a current flow direction during a data reading or writing operation of the memory cell according to FIG. 1.

As shown in FIG. 3, when the memory cell performs the data reading operation, the memory cell is configured such that a gate layer of an unselected memory cell is grounded, a negative gate voltage is applied to a gate layer of a selected memory cell (e.g., a selected memory cell in the area 100), a bias voltage is applied to a drain layer (e.g., a selected memory cell in the area 200), the substrate is grounded, and a change of the resistance state of the variable resistance layer of the selected memory cell is sensed so as to read data. Specifically, a channel current Ids is read, so as to provide a data state of the selected memory cell. Preferably, a range of the negative gate voltage is below −3 V, and the bias voltage applied to the drain layer may range from 0.5 V to 1.5 V.

Specifically, the negative gate voltage is applied to the gate layer of the selected memory cell, so that the negative gate voltage turns off a channel (e.g., "A" in FIG. 3 shows turning-off of the channel) corresponding to the variable resistance ring in the corresponding memory cell, channels of the unselected memory cells grounded are all turned on, and the read channel current is determined by the state of the selected variable resistance ring. For example, when the variable resistance ring is in a high resistance state, the read current is 0, 00 or 000; when the variable resistance ring is in a certain resistance state, the read current is a certain numerical state corresponding to this resistance state, such as 01, 10, 010, 011, 0111, or the like; and when the variable resistance ring is in the lowest resistance state, the read current is 1, 11 or 111. It is worth noting that the specific current state read is represented by several numerical values, which are related to the number of bits in the memory cell. When the memory cell is a multi-bit memory cell, the numerical state of the read current is also a multi-bit numeral. The memory cell provided by embodiments of the present disclosure supports multi-bit memory.

As shown in FIG. 3, when the memory cell performs the data writing operation, and a word line of the memory cell is selected to achieve, for example, the data reading operation, a gate layer of an unselected memory cell is grounded, and a negative gate voltage is applied to a gate layer of a selected memory cell (such as a selected memory cell in the area 100), a writing pulse is applied to a drain layer (such as a selected memory cell in the area 200), and the substrate is grounded. The writing pulse is sufficient to induce a tunneling effect in the memory cell, so that electrons are stored in the memory cell.

Specifically, the writing pulse is a current pulse or a potential difference pulse, and the resistance state of the variable resistance ring is changed by a sudden drop of the channel current pulse or potential difference pulse. For example, the writing pulse may be a current pulse with an amplitude of 2.0 mA and a waveform of 5/60/5 ns or 5/45/3 ns. Under this pulse, a corresponding resistance state of the variable resistance ring may be $10^3\Omega$, and its corresponding data level is 00, and other data levels of the same memory cell are formed at resistances of approximately $10^4\Omega$, $10^5\Omega$ and $3\times10^5\Omega$, which correspond to the data levels of 01, 10, and 11, respectively. In embodiments of the present disclosure, the writing pulse is input through the bit line, while a plurality of bit lines are selected may support page programming.

The amplitude of the current pulse during the data writing operation of the memory unit provided by embodiments of the present disclosure is not limited, and may also be of 2.8 mA, 3.1 mA, 3.5 mA, or the like, and the waveform is not limited to 5/60/5 ns, 5/45/3 ns, or the like. In addition, the data levels corresponding to the resistance states of the variable resistance ring described above are only examples, which do not constitute a limitation of embodiments of the present disclosure, and a specific value of the data level is related to the number of bits that can be written into the memory cell, the material of the variable resistance ring in practical applications, the amplitude of the applied pulse, and the number of bits in the memory cell, which are not limited by embodiments of the present disclosure.

Figure 4:
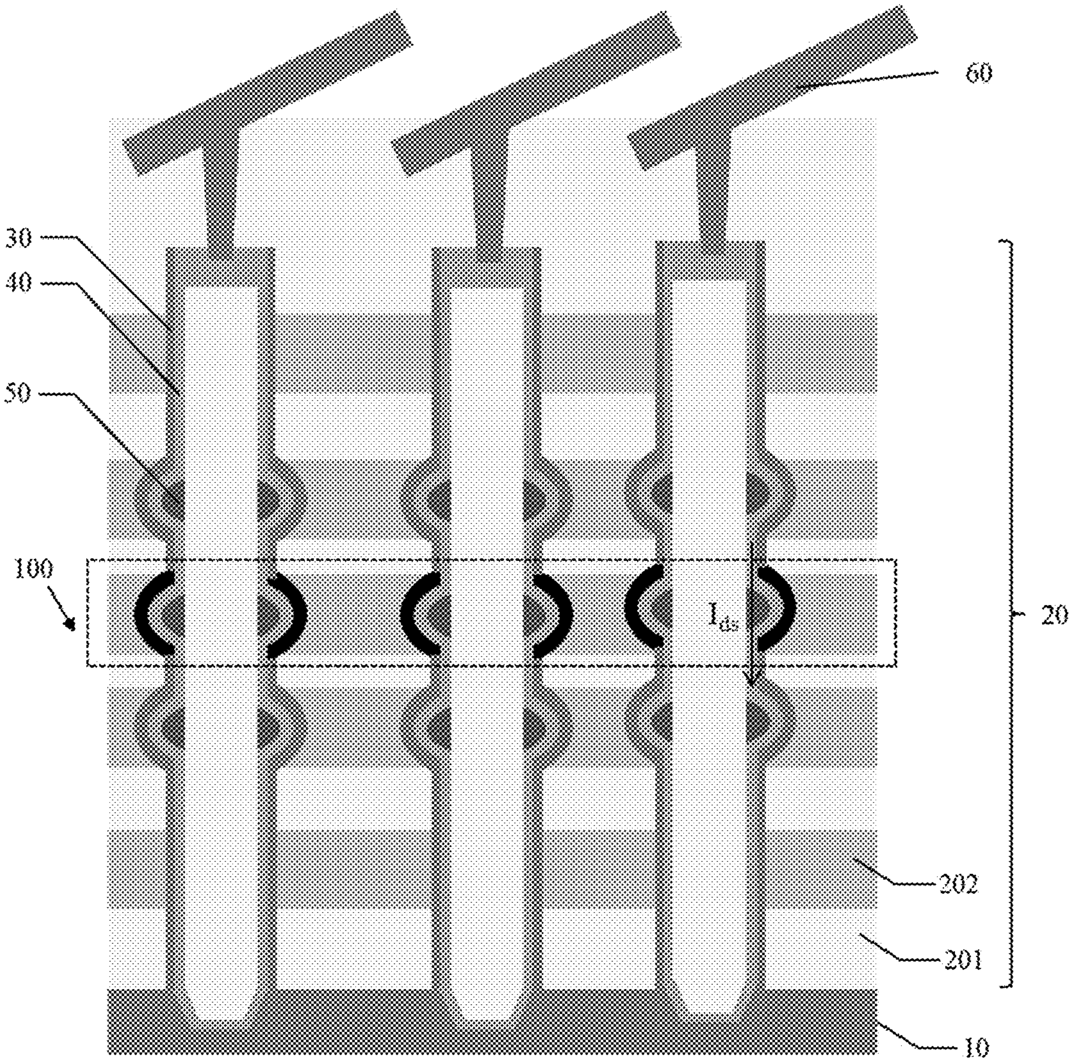
FIG. 4 shows a schematic diagram of a current flow direction during a data erasing operation of the memory cell according to FIG. 1.

As shown in FIG. 4, when the memory cell performs the data erasing operation, and a word line of the memory cell is selected to achieve, for example, the data reading operation, a gate layer of an unselected memory cell is grounded, and a negative gate voltage is applied to a gate layer of a selected memory cell (for example, a selected memory cells in the area 100), and an erasing pulse is applied to a drain layer of the memory cell. The erasing pulse is sufficient to induce a tunneling effect in the three-dimensional memory.

Specifically, the erasing pulse is a current pulse or a potential difference pulse. By a slow drop of the channel current pulse or potential difference pulse, all variable resistance rings in the same word line layer may be erased at once, thereby supporting a block erase. For example, the erasing pulse may be a forward voltage pulse with an amplitude of 1.5 V and a waveform of 5/50/5 cns. Under this pulse, all programmed data states are erased, for example, the data states 00, 01 and 10 are erased to generate a data state 11 (SET state), etc.

In embodiments of the present disclosure, the variable resistance rings formed by the variable resistance layer 50 are physically isolated from each other and do not interfere with each other. By using the negative voltage to operate the word line, no writing interference is on non-corresponding variable resistance ring, so that there is no coupling interference between the word lines.

The amplitude of the voltage pulse during the data erasing operation of the memory cell provided by embodiments of the present disclosure is not limited, and the voltage pulse may also be a voltage pulse with another amplitude and waveform. In addition, the resistance state of the variable resistance ring that needs to be erased is only an example, which does not constitute a limitation of embodiments of the present disclosure. The specific numerical that needs to be erased and the number of erasable bits of the memory cell are determined according to the actual application process, which are not limited by embodiments of the present disclosure.

The memory cell provided by embodiments of the present disclosure may use a logic control unit to achieve the word line selection, the bit line selection, and the setting of the voltage bias or pulse signal applied, thereby efficiently achieving operations such as block erase and page programming.

FIG. 5A to FIG. 5H schematically show structural schematic diagrams corresponding to steps of a method of manufacturing a memory cell respectively according to an embodiment of the present disclosure. The structure of the memory cell manufactured through the steps in the method is as shown in FIG. 1 or FIG. 2.

As shown in FIG. 5A to FIG. 5H, the method of manufacturing the memory cell includes steps S501 to S508.

Figure 5A:
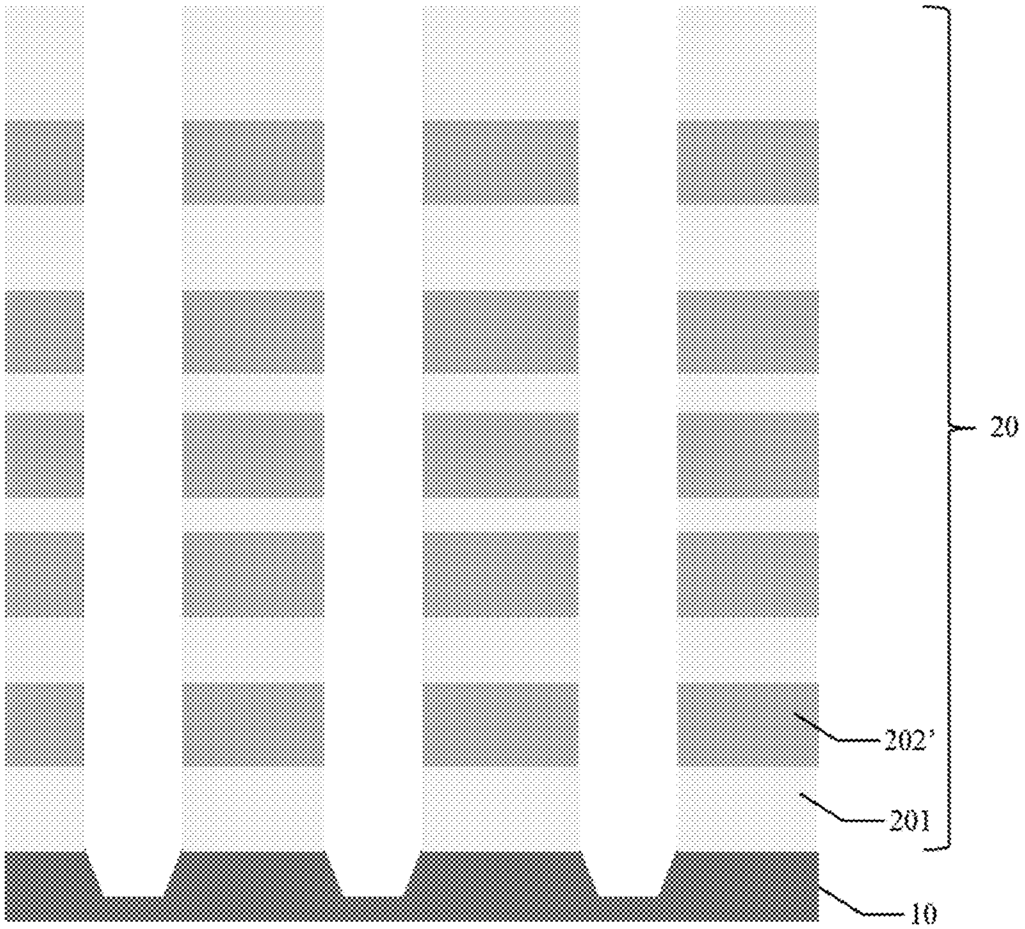
FIG. 5A to FIG. 5H schematically show structural schematic diagrams corresponding to steps of a method of manufacturing a memory cell respectively according to an embodiment of the present disclosure.

In step 501, as shown in FIG. 5A, a plurality of channel holes are formed in the stack 20 on the substrate 10. The number of channel holes is more than one, which may be 1, 2, 3 . . . , or any number.

Figure 5B:
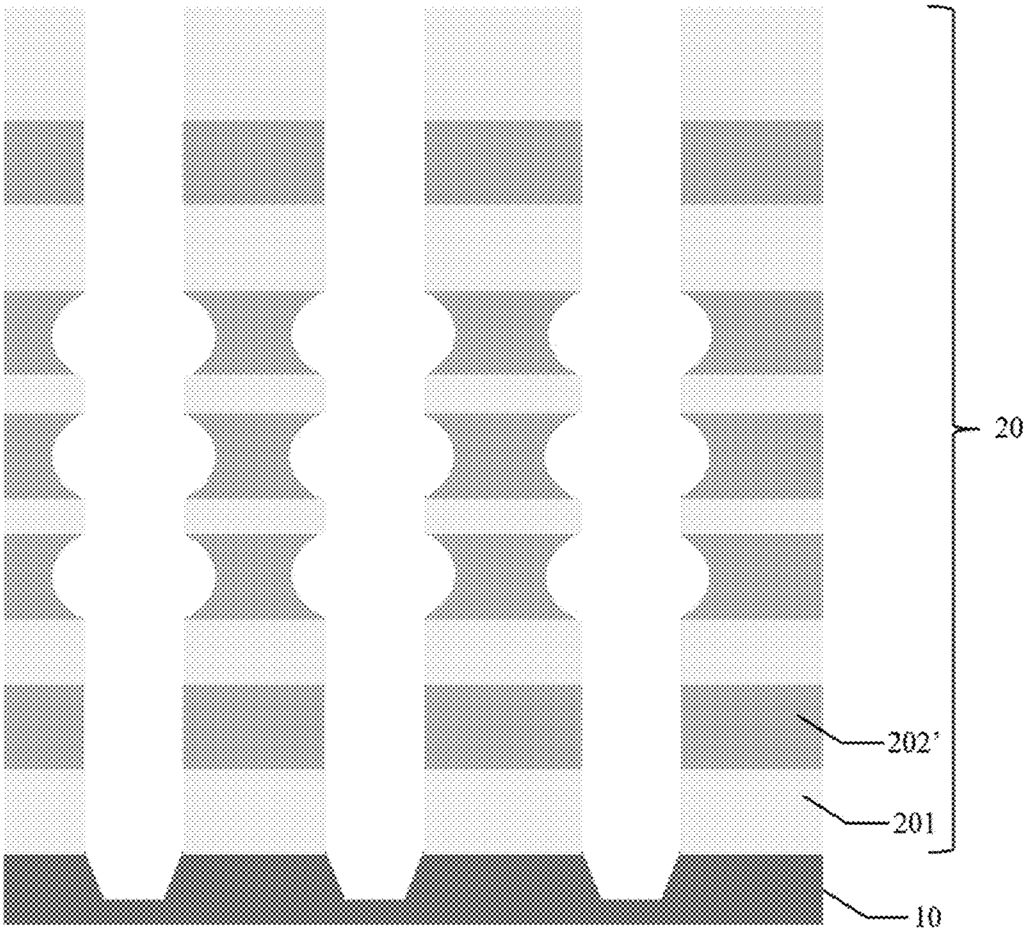

In step 502, as shown in FIG. 5B, at least one sacrificial layer in the stack formed with the plurality of channel holes is etched to form a ring-shaped limiting component.

Specifically, as shown in FIG. 5B, the stack 20 includes a plurality of pairs of stacked layers, each pair of stacked layers includes a first stack material layer 201 and a second stack material layer 202'. The first stack material layer 201 is an insulator layer, and the second stack material layer 202' is a sacrificial layer. A word line layer among the second stack material layers 202' closest to the substrate 10 serves as a lower selection layer, and a word line layer among the second stack material layers 202' farthest away from the substrate 10 serves as an upper selection layer. The sacrificial layers corresponding to the lower selection layer and the upper selection layer may be made of carbon-doped silicon nitride, so that the sacrificial layers corresponding to the lower selection layer and the upper selection layer are not etched to form the ring-shaped limiting component during the etching process of the ring-shaped limiting component. Other sacrificial layers for the second stack material layers 202' other than the lower selection layer and the upper selection layer may be made of silicon nitride, and are each etched to form the ring-shaped limiting component.

Figure 5C:
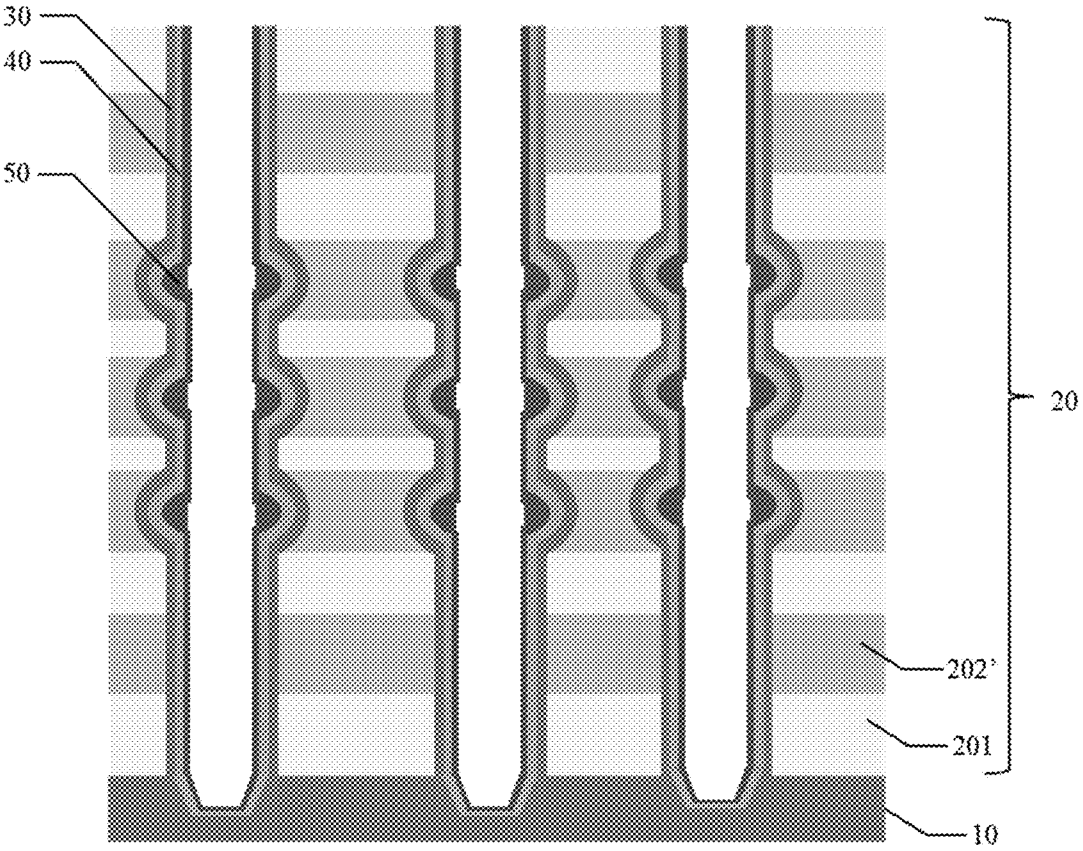

In step 503, as shown in FIG. 5C, a gate dielectric layer 30, a channel layer 40 and a variable resistance layer 50 are sequentially formed on the surface of each channel hole which is etched to form the ring-shaped limiting component.

Figure 5D:
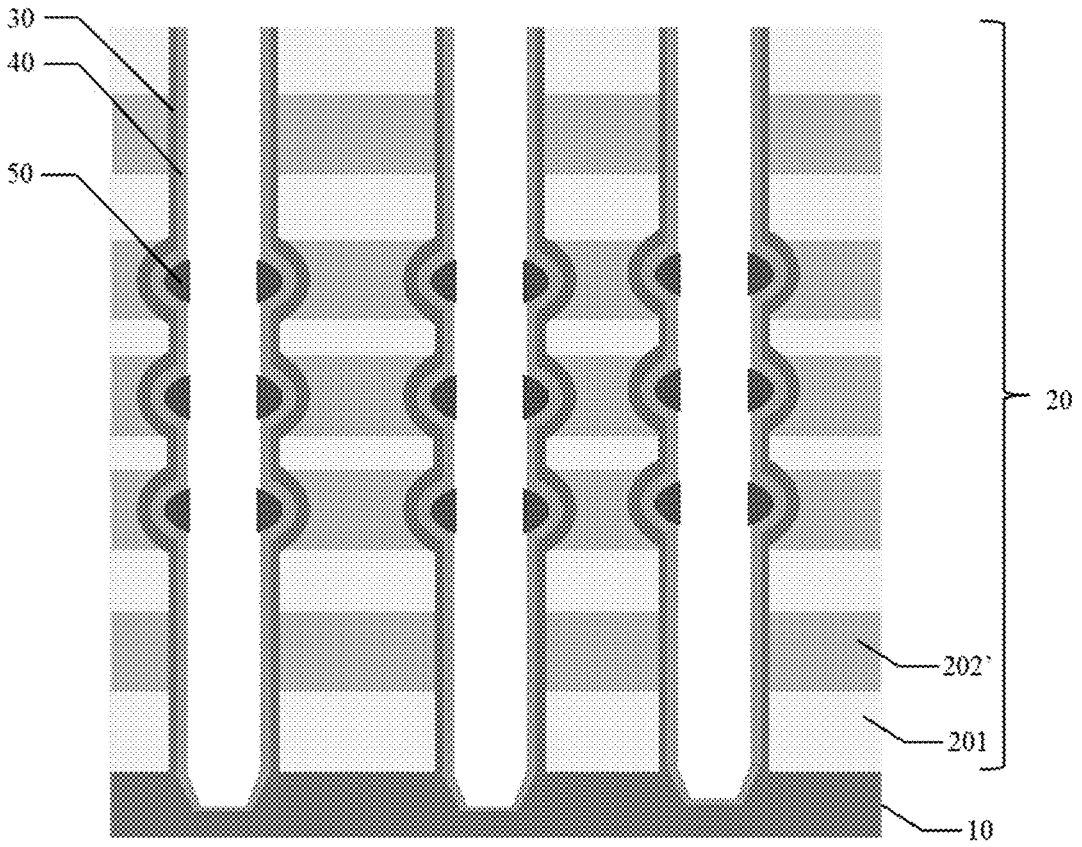

In step 504, as shown in FIG. 5D, a portion of the variable resistance layer 50 that is not corresponding to the ring-shaped limiting component is removed, so that the variable resistance layer 50 is left only at a position corresponding to the ring-shaped limiting component. The variable resistance layer 50 forms the variable resistance ring.

In embodiments of the present disclosure, the manufacturing flow of the memory cell may not include step 504. As a variable resistance film connection layer is left in the area outside the variable resistance ring (i.e., part of the residual variable resistance layer 50), and the connection layer is maintained in a high resistance state and does not participate in the data reading, writing and erasing operations, therefore step 504 may be included or may be omitted.

Figure 5E:
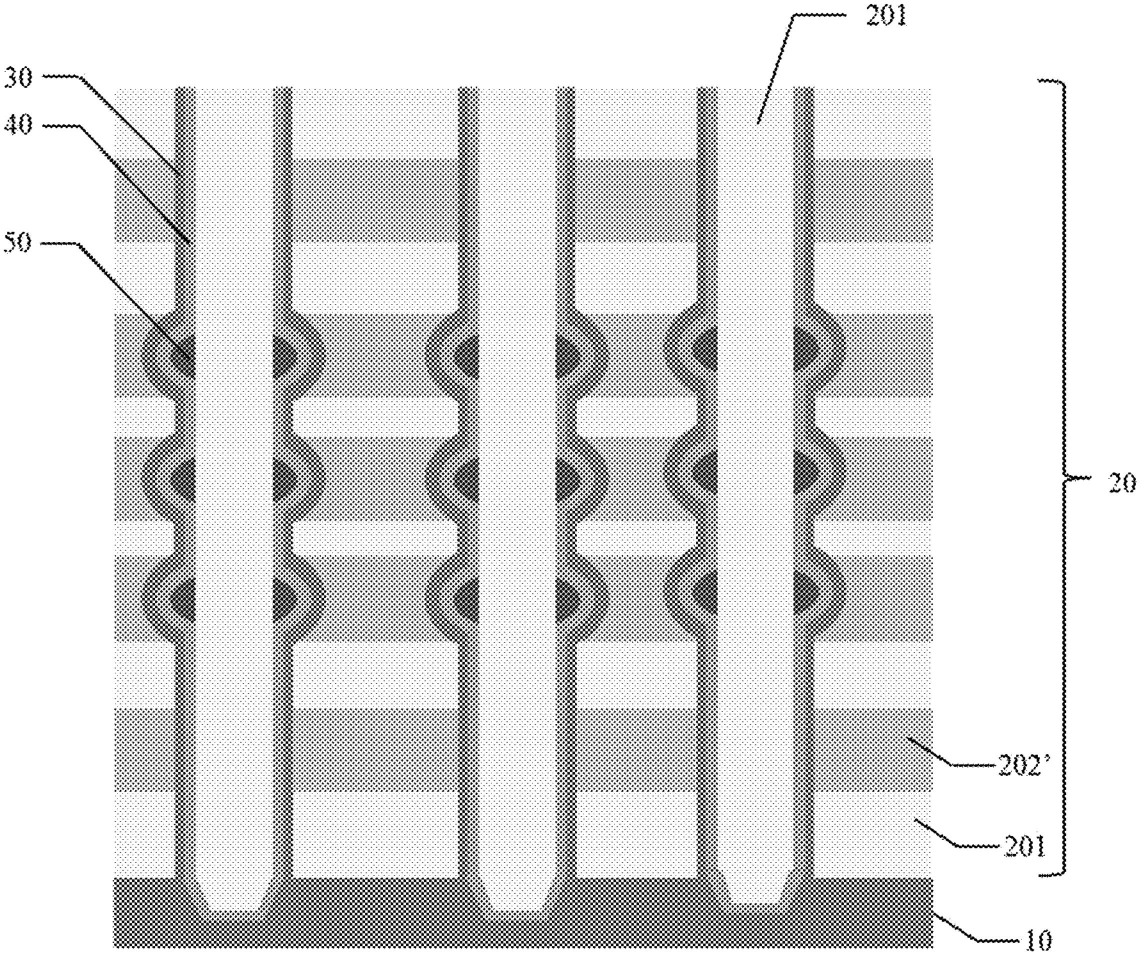

In step 505, as shown in FIG. 5E, an insulator material layer 201 is filled inside each channel hole without the material layer therein.

Figure 5F:
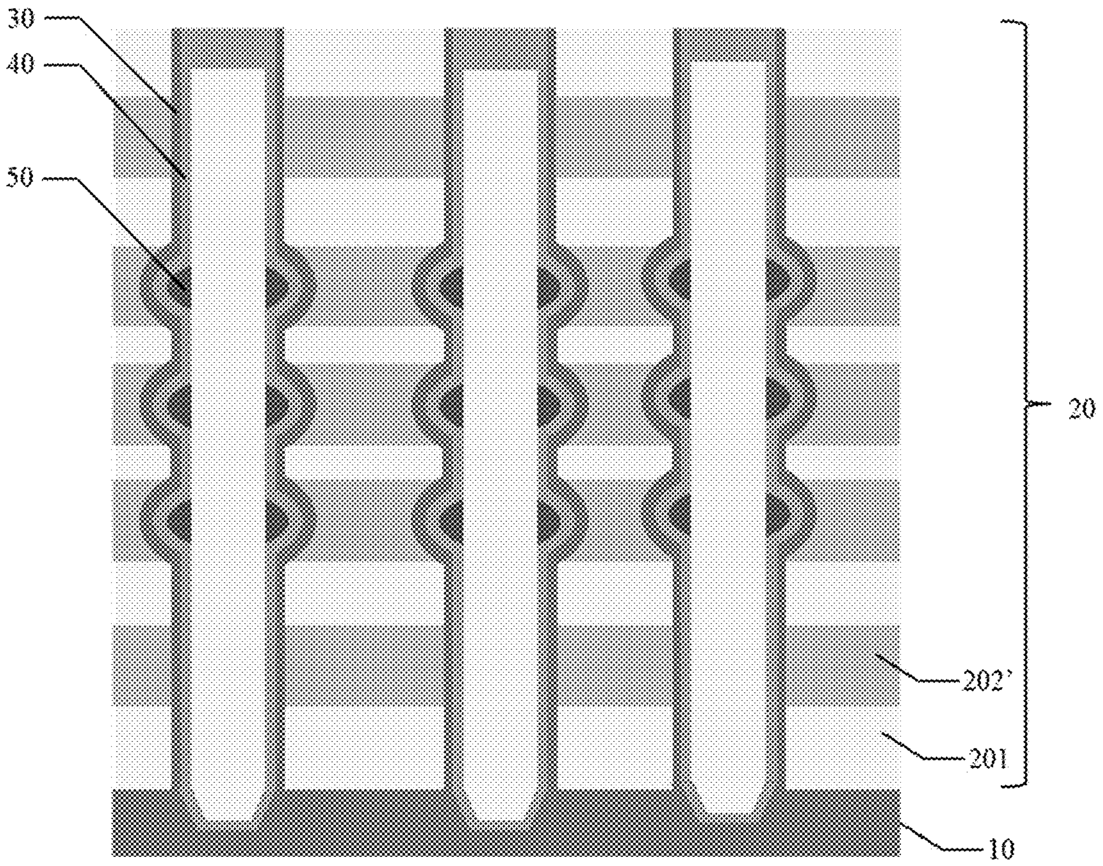

In step 506, as shown in FIG. 5F, a bit line lead out end is formed on a part of a top of the channel layer 40.

Figure 5G:
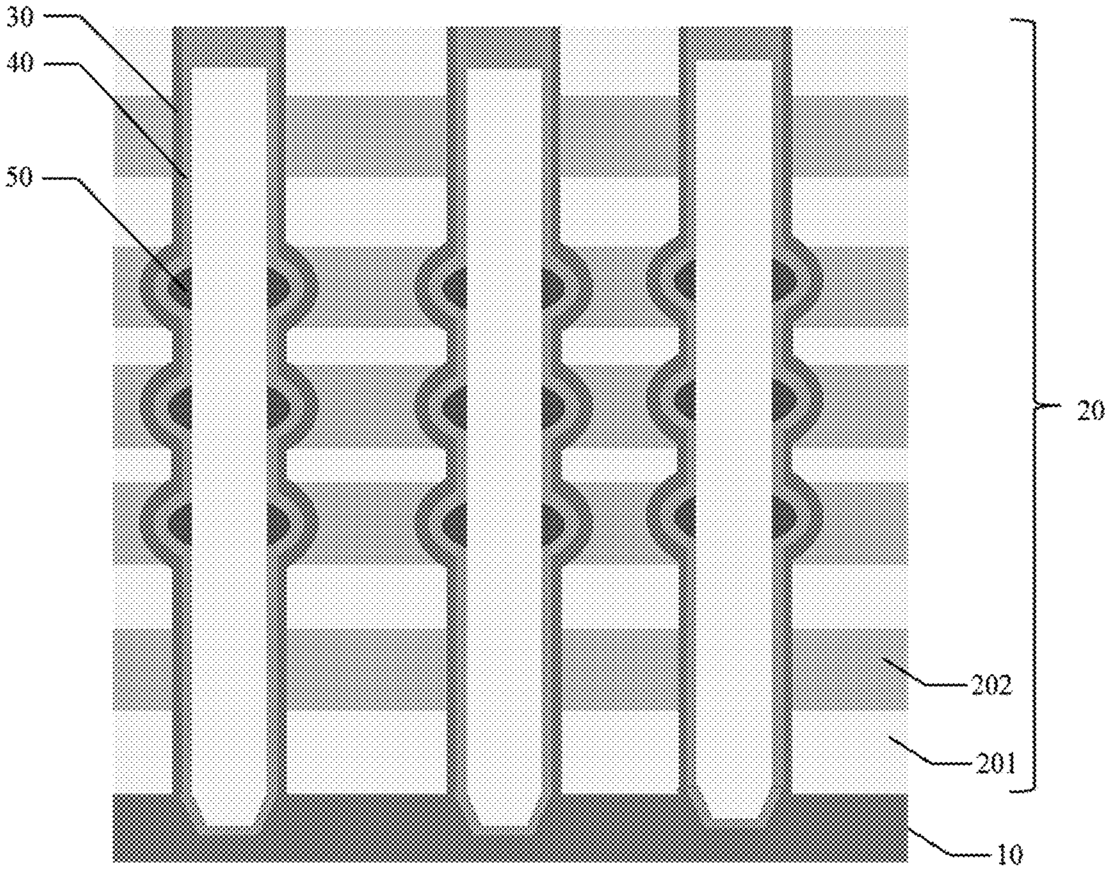

In step 507, as shown in FIG. 5G, the sacrificial layer 202' in the stack 20 is etched, and the sacrificial layer 202' is replaced with a second stack material layer 202. The second stack material layer 202 is a metal dielectric layer, which serves as the word line layer.

Figure 5H:
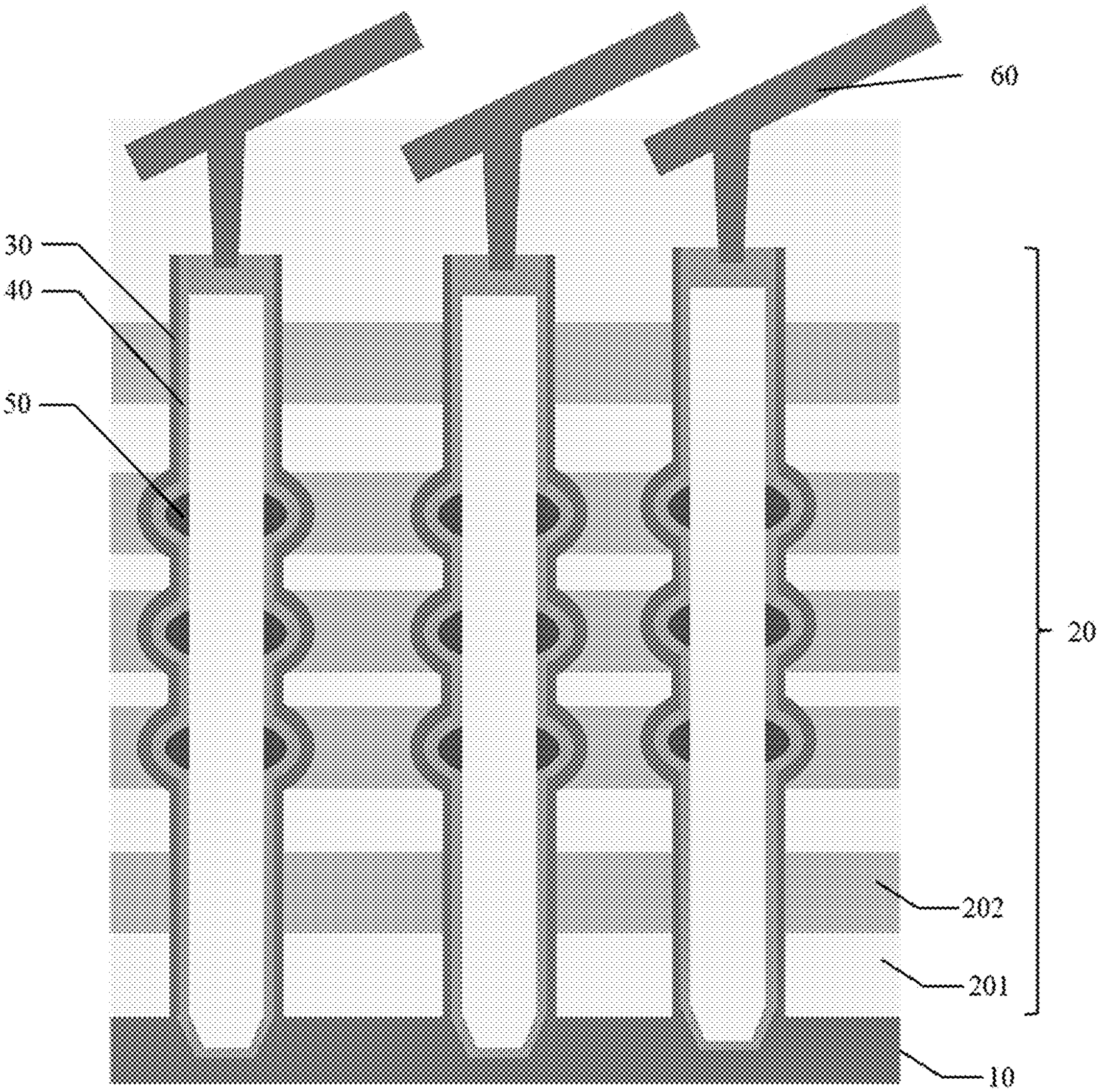

In step 508, as shown in FIG. 5H, a metal is deposited to form a bit line 60, and the manufacturing of the memory cell is completed.

The structural diagram shown in FIG. 5H is namely the structural diagram shown in FIG. 1. In FIG. 5H, it will be understood that the process adopted in the removal of part of the structure is not limited to the wet etching process and the photolithography process, it may be a combination of the two, or other dry etching or wet etching processes.

It is worth noting that in embodiments of the present disclosure, the structure of the memory cell manufactured through the manufacturing process described above is as shown in FIG. 1, and a specific thickness of each layer thereof is determined according to the actual application. In addition, embodiments of the respective steps described above are only examples, illustrating how to manufacture the memory cell of the present disclosure on an existing conventional device structure. In the present disclosure, any manufacturing process that is capable of forming the structures and positional relationship of the various portions of the memory cell described above falls within the scope of protection of the present disclosure.

In another exemplary embodiment of the present disclosure, a three-dimensional memory is provided, including any memory cell described in the present disclosure.

In this embodiment, the three-dimensional memory may further include: a logic control unit, and the memory cell is connected to a front side of the logic control unit. The three-dimensional memory may be a three-dimensional NAND memory.

In this embodiment, the word line selection, bit line selection and the setting of the voltage bias or pulse signal applied may be implemented through the logic control unit, thereby achieving such as the block erasure, the page programming, and other operations.

In yet another exemplary embodiment of the present disclosure, an operation method of the three-dimensional memory described above is provided. The operation method includes: controlling a voltage bias applied to the substrate, the drain layer and the gate layer of at least one memory cell in the three-dimensional memory; and performing data writing, reading and erasing operations on the at least one memory cell in the three-dimensional memory, separately.

The operation method includes a data reading operation method, a data erasing operation method and a data writing operation method, and there is no fixed order when performing the data reading operation method, the data erasing operation method and the data writing operation method.

Figure 6:
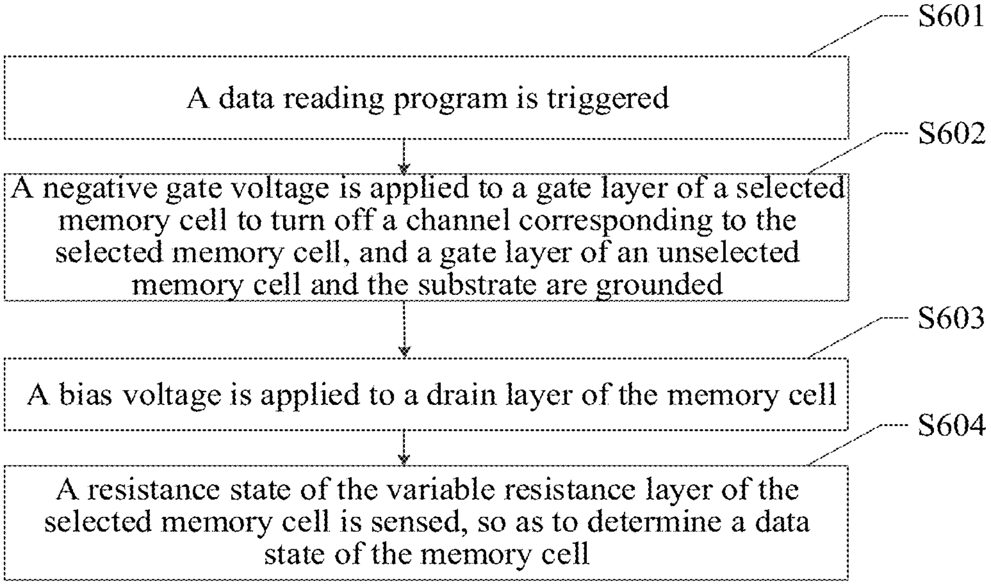
FIG. 6 schematically shows a flow chart of a data reading operation method of a three-dimensional memory according to an embodiment of the present disclosure.

As shown in FIG. 6, the data reading operation method includes steps S601 to S604.

In step S601, a data reading program is triggered.

In step S602, a negative gate voltage is applied to a gate layer of a selected memory cell to turn off a channel corresponding to the selected memory cell, and a gate layer of an unselected memory cell and the substrate are grounded.

In step S603, a bias voltage is applied to a drain layer of the memory cell.

In step S604, a resistance state of the variable resistance layer of the selected memory cell is sensed, so as to determine a data state of the memory cell.

In this embodiment, when performing the data reading operation on the memory, the configuration of each of the drain layer, the substrate and the gate layer is as described in the above embodiments, which will not be repeated in detail here.

Figure 7:
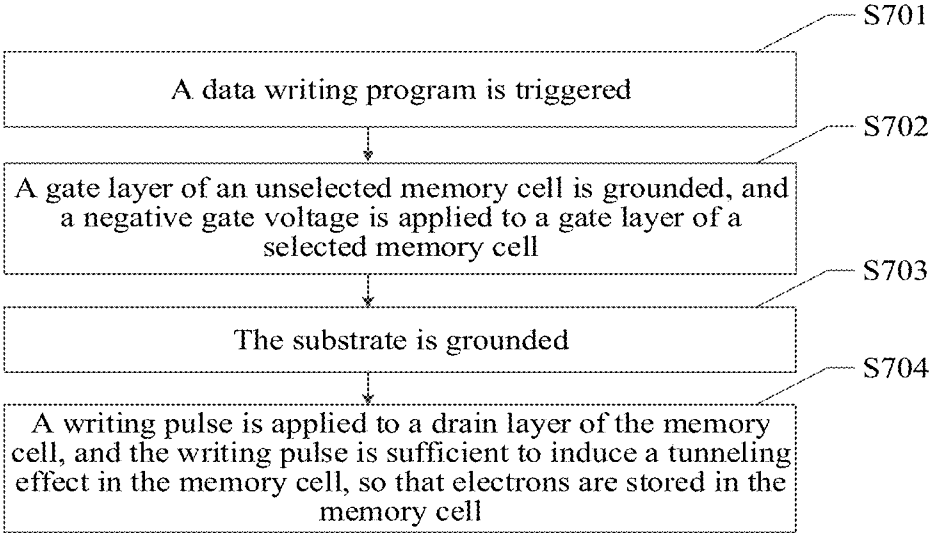
FIG. 7 schematically shows a flow chart of a data writing operation method of a three-dimensional memory according to an embodiment of the present disclosure.

As shown in FIG. 7, the data writing operation method includes steps S701 to S704.

In step S701, a data writing program is triggered.

In step S702, a gate layer of an unselected memory cell is grounded, and a negative gate voltage is applied to a gate layer of a selected memory cell.

In step S703, the substrate is grounded.

In step S704, a writing pulse is applied to a drain layer of the memory cell, where the writing pulse is sufficient to induce a tunneling effect in the memory cell, so that electrons are stored in the memory cell.

In this embodiment, when performing the data writing operation on the memory, the configuration of each of the drain layer, the substrate and the gate layer is as described in the above embodiments, which will not be repeated in detail here.

Figure 8:
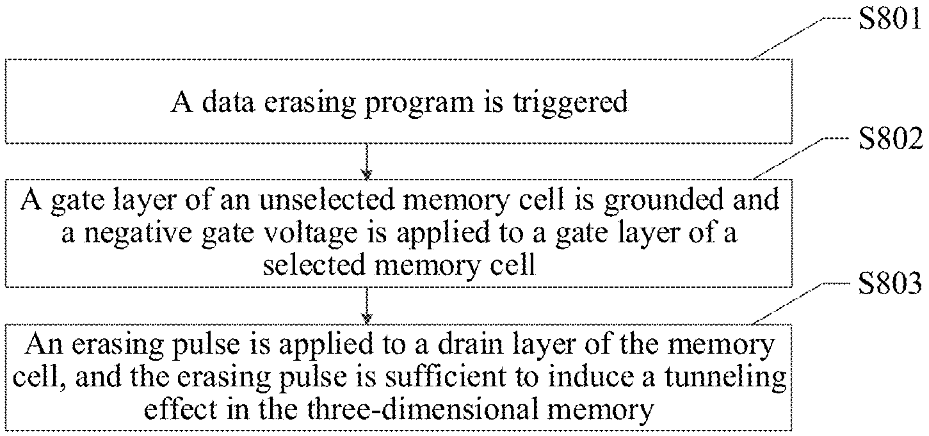
FIG. 8 schematically shows a flow chart of a data erasing operation method of a three-dimensional memory according to an embodiment of the present disclosure.

As shown in FIG. 8, the data erasing operation method includes steps S801 to S803.

In step S801, a data erasing program is triggered.

In step S802, a gate layer of an unselected memory cell is grounded and a negative gate voltage is applied to a gate layer of a selected memory cell.

In step S803, an erasing pulse is applied to a drain layer of the memory cell, where the erasing pulse is sufficient to induce a tunneling effect in the three-dimensional memory.

In this embodiment, when performing the data erasing operation on the memory, the configuration of each of the drain layer, the substrate and the gate layer is as described in the above embodiments, which will not be repeated in detail here.

It is worth noting that the operation method is not limited to these steps, and other steps omitted from description may be adjusted accordingly according to actual situations.

From the above descriptions, it may be seen that the above-mentioned embodiments of the present disclosure achieve at least the following technical effects.

1) The present disclosure provides a memory cell, which uses an N-type semiconductor channel and achieves a selection of a memory cell by turning off a corresponding channel by applying a negative voltage to the word line.

2) By forming a ring-shaped limiting component inside the channel hole, the variable resistance ring is formed after the variable resistance layer is deposited, and a resistance state of a corresponding variable resistance ring may be read by reading the channel current.

3) For the variable resistance ring, a multi-bit memory writing and supporting page programming are achieved through a sudden falling pulse.

4) For the variable resistance ring, an erasing operation and supporting block erase are achieved through a slow falling pulse.

Although the present disclosure has been illustrated and described in detail in the accompanying drawings and the foregoing descriptions, such illustrations and descriptions should be considered illustrative or exemplary rather than limiting the present disclosure.

It will be understood by those skilled in the art that the features recited in the various embodiments and/or claims of the present disclosure may be combined and/or integrated in various ranges, even if such combinations or integrations are not explicitly listed in the present disclosure. In particular, various combinations and/or integrations of features recited in the various embodiments and/or claims of the present disclosure may be made without departing from the spirit and teachings of the present disclosure. All such combinations and/or integrations fall within the scope of the present disclosure.

Although the present disclosure has been illustrated and described with reference to the specific exemplary embodiments of the present disclosure, those skilled in the art will understand that various modifications in form and details may be made to the present disclosure without departing from the spirit and scope of the present disclosure as defined by the appended claims and their equivalents. Therefore, the scope of the present disclosure should not be limited to the above-described embodiments, but should be determined not only by the appended claims but also by the equivalents of the appended claims.

What is claimed is:

1. A memory cell, comprising:

a stack on a substrate and comprising a plurality of channel holes passing through the stack and a part of the substrate, wherein the stack formed with the plurality of channel holes comprises at least one second stack material layer, and a ring-shaped limiting component is formed by etching the at least one second stack material layer;

a gate dielectric layer on a surface of the plurality of channel holes for which the ring-shaped limiting component is formed by etching;

a channel layer on a surface of the gate dielectric layer; and a variable resistance layer on a surface of the channel layer corresponding to the ring-shaped limiting component, wherein a gate voltage applied to the at least one second stack material layer and a pulse signal applied to a bit line connected to the channel layer are controlled to change a resistance state of the variable resistance layer, so as to enable the memory cell to perform a reading operation, a writing operation or an erasing operation on the variable resistance layer.

2. The memory cell according to claim 1, wherein the stack comprises a plurality of pairs of stacked layers, each pair of stacked layers comprises a first stack material layer and the second stack material layer, and the first stack material layer and the second stack material layer are sequentially stacked on the substrate.

3. The memory cell according to claim 2, wherein the first stack material layer is an insulator layer, the second stack material layer is a metal dielectric layer, and the metal dielectric layer serves as a word line layer.

4. The memory cell according to claim 1, wherein a number of second stack material layers is positively correlated with a number of layers in the memory cell.

5. The memory cell according to claim 1, wherein the variable resistance layer is made of a variable resistance material or a phase change material.

6. The memory cell according to claim 1, wherein an array formed by the plurality of channel holes passing through the stack and the part of the substrate has a common source.

7. The memory cell according to claim 1, wherein the channel layer is an N-type semiconductor channel layer, and the substrate is an N-type substrate.

8. The memory cell according to claim 7, wherein the channel layer is an N-type polycrystalline semiconductor channel layer or an N-type single crystal semiconductor channel layer.

9. The memory cell according to claim 1, further comprising:

an insulator material layer inside the plurality of channel holes without the material layer therein.

10. The memory cell according to claim 1, wherein the memory cell is configured such that: when a data reading operation is performed on the memory cell, a current flows from a drain layer of the memory cell to the substrate.

11. The memory cell according to claim 10, wherein the memory cell is configured such that:

when the data reading operation is performed on the memory cell, a bias voltage is applied to the drain layer, and the substrate is grounded;

a gate layer of an unselected memory cell is grounded, and a negative gate voltage is applied to a gate layer of a selected memory cell; and a resistance state of the variable resistance layer of the selected memory cell is sensed, so as to determine a data state of the memory cell.

12. The memory cell according to claim 1, wherein the memory cell is configured such that:

when a data writing operation is performed on the memory cell, a gate layer of an unselected memory cell is grounded, and a negative gate voltage is applied to a gate layer of a selected memory cell;

the substrate is grounded; and a writing pulse is applied to a drain layer of the memory cell, wherein the writing pulse is sufficient to induce a tunneling effect in the memory cell, so that electrons are stored in the memory cell.

13. The memory cell according to claim 1, wherein the memory cell is configured such that:

when a data erasing operation is performed on the memory cell, a drain layer of the memory cell is floated or grounded, and an erasing pulse is applied to a drain layer of the memory cell, wherein the erasing pulse is sufficient to induce a tunneling effect in the memory cell.

14. A method of manufacturing a memory cell, comprising:

forming a stack on a substrate;

forming a plurality of channel holes in the stack and a part of the substrate, and etching at least one sacrificial layer in the stack formed with the plurality of channel holes to form a ring-shaped limiting component;

forming a gate dielectric layer, a channel layer and a variable resistance layer sequentially on a surface of each channel hole for which the ring-shaped limiting component is formed by etching;

filling an insulator material layer inside each channel hole without the material layer therein;

forming a bit line lead-out end on a part of a top of the channel layer; and etching the sacrificial layer in the stack, and replacing the sacrificial layer with a second stack material layer, wherein a gate voltage applied to at least one second stack material layer and a pulse signal applied to a bit line connected to the channel layer are controlled to change a resistance state of the variable resistance layer, so as to enable the memory cell to perform a reading operation, a writing operation or an erasing operation on the variable resistance layer.

15. A three-dimensional memory, comprising the memory cell according to claim 1.

16. An operation method of the three-dimensional memory according to claim 15, comprising:

controlling a voltage bias applied to a substrate, a drain layer and a gate layer of at least one memory cell in the three-dimensional memory, and performing a data writing operation, a data reading operation and a data erasing operation on the at least one memory cell in the three-dimensional memory, separately.

17. The operation method according to claim 16, wherein performing the data reading operation on the at least one memory cell in the three-dimensional memory comprises:

triggering a data reading program;

applying a negative gate voltage to a gate layer of a selected memory cell to turn off a channel corresponding to the selected memory cell;

grounding a gate layer of an unselected memory cell and the substrate;

applying a bias voltage to a drain layer of the memory cell; and sensing a resistance state of the variable resistance layer of the selected memory cell, so as to determine a data state of the memory cell.

18. The operation method according to claim 16, wherein performing the data writing operation on the at least one memory cell in the three-dimensional memory comprises:

triggering a data writing program;

grounding a gate layer of an unselected memory cell, and applying a negative gate voltage to a gate layer of a selected memory cell;

grounding the substrate; and applying a writing pulse to a drain layer of the memory cell, wherein the writing pulse is sufficient to induce a tunneling effect in the memory cell, so that electrons are stored in the memory cell.

19. The operation method according to claim 16, wherein performing the data erasing operation on the at least one memory cell in the three-dimensional memory comprises:

triggering a data erasing program;

grounding a gate layer of an unselected memory cell, and applying a negative gate voltage to a gate layer of a selected memory cell; and applying an erasing pulse to a drain layer of the memory cell, wherein the erasing pulse is sufficient to induce a tunneling effect in the three-dimensional memory.

* * * * *